United States Patent [19]

Milberger et al.

[11] Patent Number: 4,577,166

[45] Date of Patent: Mar. 18, 1986

[54] MINIATURE HIGH PERFORMANCE PULSED MODULATOR APPARATUS

[75] Inventors: Walter E. Milberger, Severna Park; Franklin B. Jones, Baltimore, both of Md.

[73] Assignee: The United States of America as represented by the Secretary of the Air Force, Washington, D.C.

[21] Appl. No.: 643,201

[22] Filed: Aug. 22, 1984

[51] Int. Cl.$^4$ .............................................. H03K 7/08
[52] U.S. Cl. .................................. 332/9 T; 332/9 R; 375/71; 307/106
[58] Field of Search ................ 332/9 R, 9 T; 375/22, 375/23, 71; 307/106

[56] References Cited

U.S. PATENT DOCUMENTS 4,356,457  10/1982  Di Carlo ............................... 332/3

FOREIGN PATENT DOCUMENTS 0159197  5/1964  U.S.S.R. ............................... 332/9 T

Primary Examiner—Eugene R. LaRoche
Assistant Examiner—Robert J. Pascal
Attorney, Agent, or Firm—Donald J. Singer; William Stepanishen

[57] ABSTRACT

A pulsed modulator apparatus having a ground deck clock driver unit to provide pulse stretching and on-off trigger signals for a floating deck transistor switch unit. Voltage isolation is achieved between the ground and floating deck units through the use of trigger transformers.

7 Claims, 2 Drawing Figures

MINIATURE HIGH PERFORMANCE PULSED MODULATOR APPARATUS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to modulators, and in particular to a miniature high performance pulsed modulator apparatus.

This disclosure describes a versatile pulsed modulator that can be used for a variety of applications. The advanced F-16 transmitter will use the device to gate the control anode of a driver traveling wave tube (TWT) microwave amplifier. In its present form, the modulator will provide a pulsed voltage in excess of 1500 volts at PRF's up to 1 MHz with continuously variable pulsed widths from 50 Nano-seconds to 100 milliseconds. In order to conform to the size restraints of the F-16 transmitter, the pulser is packaged in a volume of less than 3 cubic inches.

SUMMARY OF THE INVENTION

The present invention utilizes a pulsed modulator comprising a ground deck pulser unit and a floating deck pulser unit in order to bracket the modulation gate which is applied to the final microwave power amplifier of a radar transmitter unit. Output signal bracketing is necessary to account for ground to floating deck command delay to the power amplifier pulser unit of the transmitter. Thus, the ground deck portion of the driver modulator provides pulse stretching and generates ON-OFF triggers for the floating deck field effect transistor switches. A ground to floating deck voltage isolation of 5 kilovolts is provided by trigger transformers. This isolation can be extended to 20-100 Kilovolts by increasing the package volume. Both active and passive floating deck circuit elements are heat sunk to a cold plate via boron nitride slabs which provide 5 KV voltage isolation from ground.

It is one object of the present invention, therefore, to provide an improved high performance pulsed modulator apparatus.

It is another object of the invention to provide an improved pulsed modulator apparatus which utilizes a versatile integrated circuit ground deck pulser that provides pulse conditioning for a number of functions.

It is yet another object of the invention to provide an improved pulsed modulator apparatus in which the floating deck FET gate voltage is controlled to provide the on and off switch commands of the modulation.

It is still another object of the invention to provide an improved pulsed modulator apparatus that utilizes a composite ON-OFF FET floating deck switch circuit configuration which includes isolation trigger transformers.

It is a further object of the invention to provide an improved pulsed modulator apparatus that utilizes a mechanical package which provides heat sinking and housing for the miniature pulser circuit elements.

It is yet a further object of the invention to provide an improved pulsed modulator apparatus that provides the cost effectiveness of an in-expensive throw-away module which makes it unique in the high voltage transmitter application.

These and other advantages, objects and features of the invention will become more apparent after considering the following description taken in conjunction with the illustrative embodiment in the accompanying drawings.

DESCRIPTION OF THE PREFERRED EMBODIMENT

Figure 1:
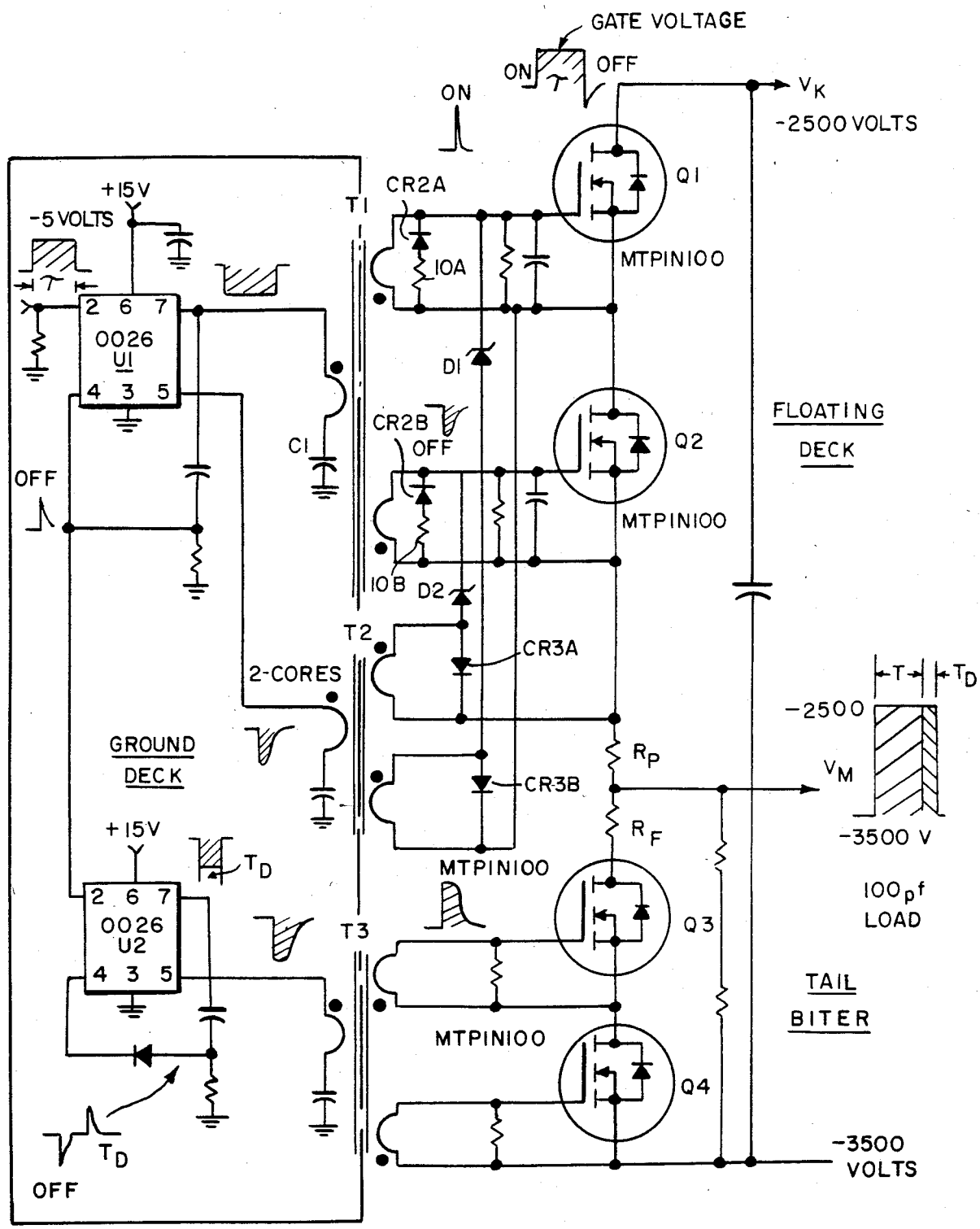
FIG. 1 is a schematic diagram of the high performance pulsed modulator apparatus according to the present invention.

Referring now to FIG. 1, there is shown a high performance pulsed modulator apparatus comprising a ground deck portion and a floating deck portion of the pulser unit. The ground deck pulser (left side of the schematic) is comprised of two eight-pin dual-in-line integrated circuit clock driver units U1, U2. The application of a TTL pulse which has a duration, T, to pin 2 of clock driver unit, U1, generates a 15-volt negative-going pulse output at pin 7. This output pulse causes current to flow through the single turn primary of transformer T1 and capacitor C1. During the first 50 nano-seconds of current flow, a 15-volt ON trigger signal is applied to the gates of transistors Q1 and Q2 by means of hold off diodes CR2A, CR2B. The trigger width is set by the voltage-time product of transformer T1. The ON trigger signal charges-up the gate input capacitance of transistors Q1 and Q2 to the 5-volt level set by the zener diodes, D1, D2. This action sustains the transistors in an ON state until a gate discharge trigger signal is received.

The turn-off trigger signal which is derived from the positive going edge of the pulse, is applied to the primary of transformer T1. This is accomplished by differentiating that pulse and applying the positive portion of it to pin 4 of clock driver unit U1. The output of clock driver unit U1 (pin 5) is applied to transformer T2. The duration of the OFF pulse signal is approximately 300 nano-seconds. The negative 15-volt trigger signal which is coupled to both secondaries of the transformer T2, discharges the gate capacitance of transistors Q1 and Q2 through the 5-volt zener diodes D1, D2. The clipper diodes CR3A and CR3B which shunt each secondary of the transformer T2, prevent after birth turn-on following the off trigger signal. The diodes CR3A and CR3B also serve as the trigger source return to the source of the FET switches. The diodes CR2A and CR2B and the 10-ohm resistor 10A, 10B in the secondaries of transformer T1 provides a return path for the off trigger signal. The 10 ohm resistor is necessary to limit the reverse recovery spike of diodes CR2A and CR2B in order to prevent the transistor gate turn-on, after the off trigger signal is removed.

In the case where the load is purely resistive, only the ON transistor chain would be required. The driver TWT modulation anode load, however, is basically capacitance and therefore requires a tail biter to discharge the load. Moreover, a 250 to 300 nano-second delay which is referred to the trailing edge of input pulse, T, is required to allow the driver output to bracket the gate signal that is applied to the final power and amplifier traveling wave tube (FPA TWT). Both of these functions are accomplished by the integrated circuit clock driver unit U2. The differentiated input signal which is applied to input pin 2 of clock driver unit U1 is also applied to input pin 2 of clock driver unit U2. The output (pin 7 of clock driver unit U1) forms a 300 nano-second pulse. This pulse is differentiated and applied to pin 4 of clock driver U2 The output (pin 5 of clock driver unit U2) which is applied to transformer T3, lags the trailing edge of input pulse T $T_D$ which is approximately 300 nano-seconds. When this pulse is inverted and applied to the gates of the tail biter transistors Q3 and Q4, the load capacitance is discharged.

Figure 2:
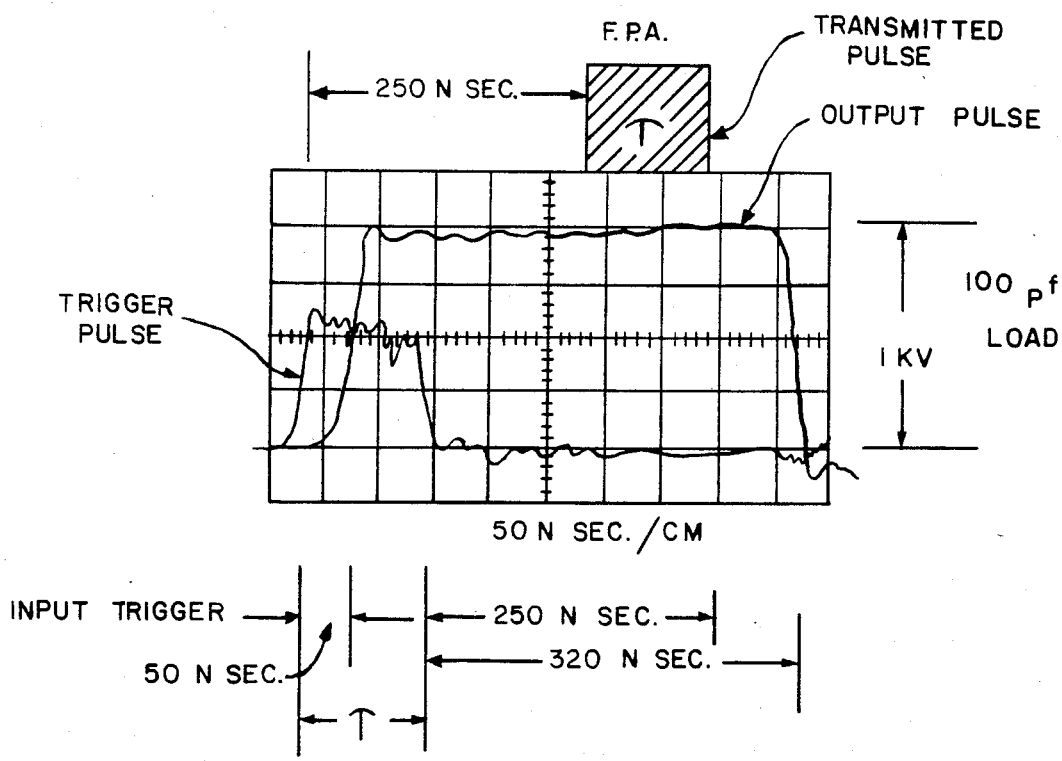
FIG. 2 is a graphical representation of the relationships between the input trigger pulse, the output pulse and the final power amplifier transmitted pulse.

Turning now to FIG. 2 there is shown the time relationship of the driver and final power amplifier modulation as referred to the ground deck input pulse, T. It should be noted that the final power amplifier (FPA) has a transport delay of approximately 250 nano-second, whereas the driver pulse width is only 50 nano-seconds. Thus, the leading edge of the driver pulse brackets the final power amplifier (FPA) pulse by approximately 200 nano-seconds. The 300 nano-second delay of the driver TWT tail biter provides a 70 nano-second trailing edge bracket of the FPA gate signal.

The waveforms which are shown in FIG. 2 were viewed when current limiting resistors $R_P$ and $R_F$ were 20 ohms. In order to damp the leading and trailing edges of the output pulse, the resistor values were increased to 120 ohms. This resulted in slower rise and fall times of about 100 nano-seconds. By increasing the value of the resistors, arc protection for the pulser unit was assured. If either a positive or negative going high energy arcs occur, the resistors, $R_P$ and $R_F$ which are 2 watt resistors, limit the current and dissipate the energy that flows through the internal transistor diodes.

The modulator apparatus described herein utilized a capacitive load, thus permitting load discharge long after the ON transistor chain is turned-off. In order to accommodate a combined resistive-capacitive load, wiring changes in the ground deck pulser are necessary. Rather than driving transformer T2 from pin 5 of clock driver unit U1, the transformer T2 is driven from pin 5 of clock driver unit U2. An inverted pulse of that output must then be applied to the pin 4 of clock driver unit U1. The inverted pulse may be obtained from an additional winding on transformer T2. The output of clock driver unit U1 which is pin 5 is then applied to transformer T3. This allows a ten nanosecond delay between turn-off of the ON chain and the turn-on of the tail biter, thus preventing switch through.

In the standard pulser application, when no turn-off delays are required, it is only necessary to apply an inverted output of pin 5 of clock driver unit U1 to pin 4 of clock driver unit U2. However, an additional winding is required on transformer T2. A variety of other configurations are possible, depending on the pulser requirements. In the case of resonant charge and discharge pulsers where only an on-off are required, the transformer T2 would be eliminated; as also would the input networks of the on-chain transistors be eliminated. The resistors $R_P$ and $R_F$ would be replaced with hold-off diodes which would feed a resonant charge choke preceeding a capacitor load.

Where d-c as well as pulsed operation is required, repetitive triggers, at a rate greater than the R-C time constant of the gates of transistors Q1 and Q2, may be applied within the period of the input signal. The turn-off signal must then be independently supplied to pin 4 of clock driver unit U1. Many variations of the present circuit and operation are possible, including a gated astable oscillator to generate the repetitive ON triggers.

The present miniature high performance pulsed modulator is an inexpensive throw-away pulser that has many applications. The miniature size of the apparatus permits its use in virtually any radar system regardless of packing restraints. Other versions of the present high performance pulsed modulator apparatus have been operated as 12 KV pulsed modulators. The relatively small turn-on delay (50 nano-seconds) makes the pulser unit a candidate for most ECM transmitters. When the pulsed modulator apparatus is operating at 300 KHz into a 100 pf load, with a one kilo-volt pulse, the modulator apparatus dissipates approximately 35 watts. If the packaging volume constants could be increased to accommodate resonant charge, the power dissipation factor could be reduced. This basic pulsed modulator design allows for ground to floating deck voltage isolation in the range of tens of kilo-volts. By increasing the volume requirements to 30 cubic inches, the pulser is capable of gating the AWAC's E32A KPA transmitter tube. Further, high quantity cost reduction is possible by using power hybrid packaging techniques.

Although the invention has been described with reference to a particular embodiment, it will be understood to those skilled in the art that the invention is capable of a variety of alternative embodiments within the spirit and scope of the appended claims.

What is claimed is:

1. A pulsed modulator apparatus comprising in combination:
   a first clock driver means receiving an input trigger pulse of a predetermined pulse width, said first clock driver means providing a first output pulse in response to said input trigger pulse, a second input pulse derived from said first output pulse and applied to said clock driver means to provide a second output pulse,
   a first coupling means connected to said first clock driver means to receive said first output pulse therefrom,
   a second coupling means connected to said first clock driver means to receive said second output pulse therefrom, and,
   a first switching means connected to both said first and second coupling means to receive the outputs therefrom, said first coupling means providing an on signal to said first switching means in response to said first output pulse, said first switching means connected between a first and second predetermined voltage, said first switching means switching from said first predetermined voltage to said second predetermined voltage, said first switching means providing an output pulse signal in response to said on signal, said second coupling means providing an off signal to said first switching means in response to said second output pulse, said first switching means switching from said second predetermined voltage to said first predetermined voltage in response to said signal, said output pulse signal having an output pulse width equal to or greater than the time difference between said first and second output pulse, said output pulse signal is applied to a load means.

2. A pulsed modulator apparatus as described in claim 1 further including:

a second clock driver means receiving said second input pulse, said second clock driver means providing a third output pulse in response to said second input pulse, a third input pulse derived from said third output pulse and applied to said second clock driver means to provide a fourth output pulse, a third coupling means connected to said second clock driver means to receive said fourth output pulse therefrom, and, a second switching means connected to said third coupling means to receive the output therefrom, said second switching means connected between said first switching means and said second predetermined voltage, said third coupling means providing an off signal to said second switching means in response to said fourth output pulse, said second switching means switching off said output pulse in response to said off signal.

3. A pulsed modulator apparatus as described in claim 2 wherein said first, second and third coupling means provide voltage isolation between said first and second clock driver means and said first and second switching means.

4. A pulsed modulator apparatus as described in claim 2 wherein said output pulse width is equal to 320 nanoseconds.

5. A pulsed modulator apparatus as described in claim 2 wherein said second input pulse is the derivative of said first output pulse.

6. A pulsed modulator apparatus as described in claim 2 wherein said third input pulse is the derivative of said third output pulse.

7. A pulsed modulator apparatus as described in claim 2 wherein said load means is a capacitive load.

* * * * *